United States Patent [19]

Willis et al.

[11] Patent Number: 4,672,642
[45] Date of Patent: Jun. 9, 1987

[54] CIRCUIT FOR GENERATING A CLOCK SIGNAL AT AN AC LINE FREQUENCY

[75] Inventors: Donald H. Willis; Enrique Rodriguez-Cavazos, both of Indianapolis, Ind.

[73] Assignee: RCA Corporation, Princeton, N.J.

[21] Appl. No.: 760,545

[22] Filed: Jul. 30, 1985

[51] Int. Cl.⁴ .................... G01D 00/00; H03K 17/60; H03K 5/00; H03K 5/08
[52] U.S. Cl. ................................ 377/20; 307/252 N; 307/261; 328/28; 328/63; 368/156
[58] Field of Search ............... 307/282, 314, 261, 269, 307/87, 252 N; 328/28, 26, 31, 32, 33, 63, 65, 179, 187; 358/150; 377/20; 368/156, 82

[56] References Cited

U.S. PATENT DOCUMENTS

| | | | |
|---|---|---|---|
| 3,183,372 | 5/1965 | Chin | 307/252 N |
| 3,576,467 | 4/1971 | Gupte | 307/252 N |
| 3,639,782 | 2/1972 | Lord | 307/252 N |
| 3,862,439 | 1/1975 | Coccio | 307/261 |
| 4,040,247 | 8/1977 | Haydon | |
| 4,052,623 | 10/1977 | Loberg | |
| 4,068,465 | 1/1978 | Bacon | 368/82 |

OTHER PUBLICATIONS

RCA Color Television Basic Service Data for CTC 111 chassis series dated 1983, cover page and schematic pp. 36-38 attached.
RCA Projection Television Basic Service Data for CTC 132 chassis series dated 1984, cover page and schematic pp. 44-46 and 59-61 attached.

Primary Examiner—Stanley D. Miller
Assistant Examiner—Trong Quang Phan
Attorney, Agent, or Firm—Eugene M. Whitacre; Joseph J. Laks; Sammy S. Henig

[57] ABSTRACT

A periodic signal, at the frequency of the AC mains supply voltage, contains signal pulses, each having a duration that is substantially shorter than half the period of the AC mains supply voltage. The periodic signal is coupled to a high frequency transformer to form a periodic output signal that is applied to a time-of-day measurement circuit that provides time-of-day display information for a television receiver. The transformer provides conductive isolation between the time-of-day measurement circuit and the AC mains supply voltage source.

20 Claims, 3 Drawing Figures

CIRCUIT FOR GENERATING A CLOCK SIGNAL AT AN AC LINE FREQUENCY

The invention relates to a circuit that generates, from an alternating current (AC) mains supply voltage, a periodic signal having a frequency that is related to the mains supply voltage frequency, for providing timing or synchronization information.

Some television receivers have signal terminals for receiving, for example, external video input signals such as R, G and B input signals, that are to be developed relative to the common conductor of the receiver. Such signal terminals and the receiver common conductor may be coupled to corresponding signal terminals and common conductors of external devices, such as, for example, a VCR or a teletext decoder.

To simplify the coupling of signals between the external devices and the television receiver, the common conductors of the receiver and of the external devices are connected together so that all are at the same potential. The signal lines of the external devices are coupled to the corresponding signal terminals of the receiver. In such an arrangement, the common conductor of each device, such as the television receiver, may be held "floating", or conductively isolated, relative to the corresponding AC mains supply source that energizes the device. When the common conductor is held floating, a user touching a terminal that is at the potential of the common conductor will not suffer an electrical shock. Such electrical shock may occur if the common conductor is not held floating. Furthermore, having the common conductor floating avoids an undesirable current flow, or a current loop, among the common conductors that are, as described above, connected together.

Therefore, it may be desirable to isolate the common conductor, or ground, of, for example, the television receiver from the potentials at the terminals of the AC mains supply source that provides power to the receiver. Such isolation is typically achieved by a transformer, as described below. The isolated common conductor is sometimes referred to as "cold" ground conductor.

In some television receivers the AC mains supply voltage is coupled directly to a bridge rectifier for producing an unregulated direct current (DC) input voltage. The unregulated DC input voltage is applied to a switching, or chopper, power supply having a chopper transformer that generates regulated DC voltages. The regulated DC voltages are, typically, developed, from a secondary winding of the chopper transformer, relative to the cold ground conductor. The chopper transformer conductively isolates the regulated voltages, thus causing them to be floating, relative to the potentials at terminals of the AC mains supply voltage source.

Circuit networks of the power supply that provide voltages that are not floating relative to the potentials at the AC mains supply voltage source terminals, such as voltages at the primary winding of the chopper transformer, are referenced to a common conductor that is, therefore, floating relative to the cold ground conductor and that is sometimes referred to as "hot" ground conductor.

Some television circuits that are energized from the regulated DC voltages utilize the cold ground conductor as the common conductor. When external video devices are coupled to the receiver, the cold ground conductor that provides current return path to, for example, the video signals of the receiver is also connected to the common conductors of the external video devices. Therefore, by making each of the common conductors floating, the above-mentioned undesirable current loop flow among the common conductors is eliminated. Additionally, a user who touches the floating common conductor will not suffer an electrical shock.

It is desirable to maintain isolation between the hot and the cold ground conductors of the television receiver when coupling signals between a circuit of the television receiver that is referenced to the hot ground conductor and a circuit in the television receiver that is reference to the cold ground conductor. For example, a periodic signal at the frequency of the mains supply voltage that is derived from a circuit that is referenced to the hot ground conductor, may provide time reference or clocking information to, for example, a time-of-day measurement circuit that is referenced to the cold ground conductor. Such time-of-day measurement circuit provides display information to the receiver for displaying the time on the television screen.

Some prior art circuits utilize a mains transformer for applying across the transformer primary winding the sinusoidal waveform of the AC mains supply source voltage. A secondary winding of such transformer supplies to the time-of-day measurement circuit a sinusoidal voltage containing the time reference or clocking information. The mains transformer functions as an isolating transformer to float or conductively isolate the voltages at terminals of the secondary winding from the voltage at the terminals of AC mains supply source. Such transformer provides both the coupling of the clocking information from the AC mains supply source and also the required isolation between the hot and cold ground conductors.

A disadvantage of such isolating transformer is that it is bulky and costly because the transformer may require the primary winding to have a large number of winding turns. The large number of turns enables the primary winding to exhibit a sufficiently high series impedance to the low frequency, low impedance AC mains supply source.

It may be desirable to obviate the need for such an isolating transformer that is excited by the sinusoidal low frequency waveform of the AC mains supply voltage source, particularly in a situation where the sole function of such a transformer is to supply a clocking signal to a time-of-day measurement circuit that is conductively isolated from the AC mains supply voltage.

In accordance with an aspect of the invention, a periodic first signal having pulses that occur at a frequency related to that of an AC input voltage is derived from the AC input voltage source. The duration of a given pulse is substantially shorter than half the period of the AC input voltage. The periodic first signal is coupled, by a magnetic coupling arrangement, to form a periodic output signal, developed relative to a first common conductor. The magnetic coupling arrangement provides conductive isolation between the first common conductor and the AC input voltage source. This first common conductor is, illustratively, the common conductor of the circuit that receives the output signal, such as a time-of-day measurement circuit.

In accordance with a further aspect of the invention, the magnetic coupling arrangement isolates the first common conductor from the AC input voltage in a frequency range from zero or DC, and up to frequencies that are higher than the frequency of the AC input voltage.

Because the pulse width of a given pulse of the periodic signal is substantially shorter than a given half-period of the AC input voltage, the magnetic coupling arrangement, that provides the periodic output signal to the receiving circuit, advantageously, requires only a small primary winding inductance. Thus, the magnetic coupling arrangement has a substantially smaller number of primary winding turns than in the primary winding of an isolating transformer used in some prior art circuits in which a sinusoidal voltage of the AC mains input voltage is directly coupled across the primary winding. It follows that the magnetic coupling arrangement, utilized in the embodiments of the invention, is substantially less bulky and less costly than the isolating line voltage transformer that is used in the above prior art circuits.

In accordance with another aspect of the invention, the AC input voltage is coupled between a pair of input terminals of a bridge rectifier that produces, between an output terminal and a current return terminal of the bridge rectifier, a rectified supply voltage that is used for energizing a load circuit such as a voltage regulator. The potential of the current return terminal provides a reference potential of the hot ground conductor. A half-wave rectified signal that is obtained from the AC input voltage is developed between a first terminal of the pair of input terminals of the bridge rectifier and the current return terminal. The half-wave rectified signal is used for generating the periodic output signal that is conductively isolated from the hot ground conductor. Advantageously, using the half-wave rectified signal simplifies the generation of the output signal, as described later on. The half-wave rectified signal is obtained by half-wave rectifying the AC input voltage by advantageously, using a portion of the same bridge rectifier that is used for producing the rectified supply voltage.

In accordance with an additional aspect of the invention, the cold ground conductor that provides a reference potential to, for example, the time-of-day measurement circuit is conductively isolated from the hot ground conductor.

In a first embodiment of the invention, the half-wave rectified signal is used for charging a capacitor through a current limiting resistor during the half-period of each cycle of the half-wave rectified signal in which the half-wave rectified signal waveform substantially follows the AC input voltage. When the voltage across the capacitor reaches a predetermined level, the energy stored in the capacitor is discharged within a duration that is substantially shorter than the half-period of the AC input voltage. The discharge current pulse flows, for example, in a single primary winding turn that is inserted through a ferrite toroidal core. A single secondary winding turn develops, for each discharge current pulse, a corresponding pulse of the output signal. Thus, the pulses of the output signal appear at the frequency of the AC input voltage. The magnetic coupling causes the output signal to be floating relative to the potentials at the terminals of the AC input voltage source and also at the terminals of the bridge rectifier.

In a second embodiment of the invention, the half-wave rectified signal energizes an oscillator that generates periodic bursts. Each burst occurs during the half-period in which the half-wave rectified signal waveform substantially follows the waveform of the AC input voltage. Each burst contains a plurality of cycles of a high frequency signal produced by the oscillator. The high frequency signal is coupled magnetically by a high frequency transformer, to a pulse shaping, or a demodulator circuit, that utilizes the potential of the cold ground conductor as a reference potential. The pulse shaping circuit produces, from the transformer coupled bursts, a signal that is at the frequency of the AC input voltage and that is floating relative to the terminals of the AC input voltage source and of the bridge rectifier.

A feature of the invention is that the oscillator begins oscillating in synchronism with the AC input voltage. Therefore, each cycle of the high frequency signal of a given burst occurs in synchronism with the AC input voltage.

Figure 1:
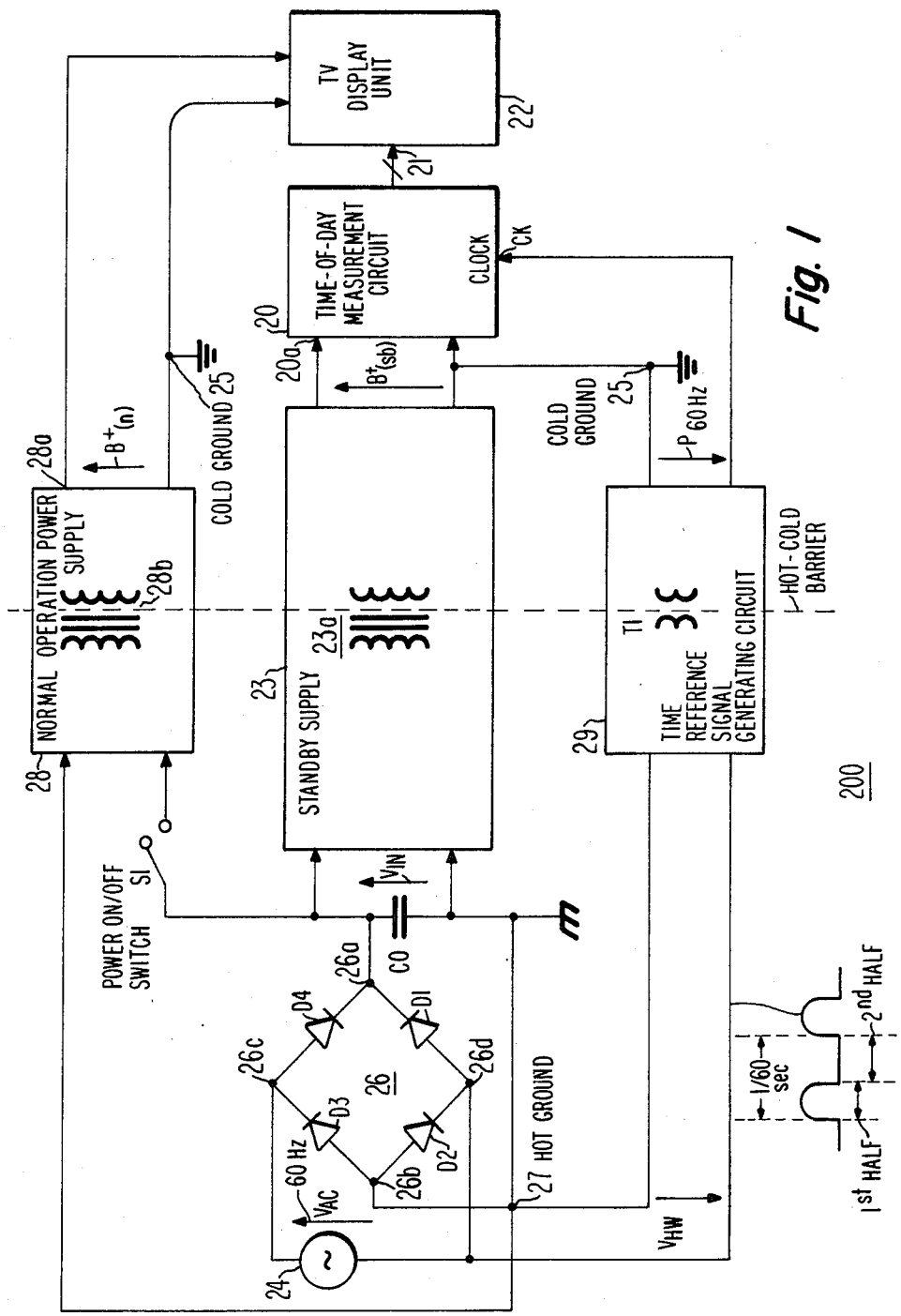
FIG. 1 illustrates, substantially in a block diagram form, a time-of-day display circuit 200 of a television receiver.

FIG. 1, illustrates a block diagram of a time-of-day display circuit 200. Circuit 200 includes a conventionally designed time-of-day measurement circuit 20 such as used, for example, in CTC 111 chassis made by RCA Corporation, to provide an output signal 21 of FIG. 1 that contains time-of-day information for display in a television display unit 22. Television display unit 22 represents the conventional television circuits that display the time-of-day on a television screen, not shown in FIG. 1.

Time-of-day measurement circuit 20 is powered, at a terminal 20a, by a DC regulated voltage $B+_{(sb)}$ that is produced by a standby supply 23. Time-of-day measurement circuit 20 includes counters that are incremented as each pulse of a signal $P_{60HZ}$ is received at a clock input terminal CK. Signal $P_{60HZ}$ is at the same frequency of an AC input voltage $V_{AC}$ that is supplied by an AC mains supply voltage source 24, as described later on. The counters of circuit 20 contain the time-of-day information that is updated by signal $P_{60HZ}$, once in each period of voltage $V_{AD}$, to provide output signal 21.

Mains supply source 24 is coupled between terminals 26c and 26d of a full-wave bridge rectifier 26, comprising diodes D1-D4, that produces a full-wave rectified unregulated voltage $V_{IN}$ that provides power to standby supply 23 and to a normal operating supply 28. Voltage $V_{IN}$ of bridge rectifier 26 is filtered by a capacitor C0 and appears between output terminal 26a and current return terminal 26b of the bridge rectifier.

Standby supply 23 produces regulated DC supply voltage $B+_{(sb)}$ between terminal 20a and a cold ground conductor 25. Supply voltage $B+_{(sb)}$ is floating or conductively isolated from AC input voltage $V_{AC}$ and from unregulated voltage $V_{IN}$. Such isolation is accomplished, in a conventional manner, by, for example, a chopper transformer 23a that is shown, symbolically in the block of FIG. 1, representing a chopper regulated standby supply 23.

Terminal 26b of bridge rectifier 26 that provides the reference potential to voltage $V_{IN}$ is connected to a hot ground conductor 27 that is used as a common conductor by those circuits of standby supply 23, that are conductively connected to the primary winding of chopper transformer 23a. The circuits of standby supply 23 that are referenced to hot ground conductor 27 are conductively isolated from those circuits referenced to cold ground conductor 25 by the hot-cold barrier formed by chopper transformer 23a. It follows that hot ground conductor 27 is conductively isolated from cold ground conductor 25 by chopper transformer 23a.

Normal operation supply 28 that may operate similarly to standby supply 23 provides a regulated voltage $B+_{(n)}$ that is floating relative to the potential of hot ground conductor 27. Voltage $B+_{(n)}$ appears between a terminal 28a of supply 28 and cold ground conductor 25 after a power on/off switch S1 is closed. Voltage $B+_{(n)}$ provides power to television display unit 22. Similarly to standby supply 23, normal operation supply 28, also maintains the isolation between cold ground conductor 25 and hot ground conductor 27 by use of a chopper transformer 28b that performs similar function as transformer 23a of standby supply 23.

Standby supply 23 provides power to time-of-day measurement circuit 20 continuously, even when switch S1 is open, so as not to interrupt the time measurement. On the other hand, normal-operation supply 28 provides power to other circuits only when the television receiver is turned on by the closing of switch S1.

A half-wave rectified signal $V_{HW}$ that represents a half-wave rectification of mains supply voltage $V_{AC}$ appears between terminal 26d of bridge rectifier 26 and hot ground conductor 27. During a first half of each period of signal $V_{HW}$, conductive diode D3 couples voltage $V_{AC}$ across the input impedance of a time reference signal generating circuit 29, as described later on. Therefore, the positive portion of signal $V_{HW}$ substantially follows the waveform of voltage $V_{AC}$. Note that the peak amplitude of signal $V_{HW}$ is not significantly more positive than voltage $V_{IN}$ because of the clamping to voltage $V_{IN}$ caused by diode D1. During the second half of each period, signal $V_{HW}$ is substantially zero relative to hot ground conductor 27.

Half-wave rectified signal $V_{HW}$ is coupled to a time reference signal generating circuit 29 that generates, from the timing information of signal $V_{HW}$, signal $P_{60HZ}$ that appears at the frequency of AC mains supply voltage $V_{AC}$. As described in more detail later on, signal $P_{60HZ}$ is floating relative to hot ground conductor 27. Isolation between hot ground conductor 27 and cold ground conductor 25 is provided by transformer T1. Signal $P_{60HZ}$ appears between clock input terminal CK of circuit 20 and cold ground conductor 25. Thus, timing signal $P_{60HZ}$ that is developed from voltage $V_{AC}$ at a rate of, for example, 60 HZ is, nevertheless, floating relative to voltage $V_{AC}$; therefore, signal $P_{60HZ}$ may be utilized by cold-side circuit 20.

Figure 2:
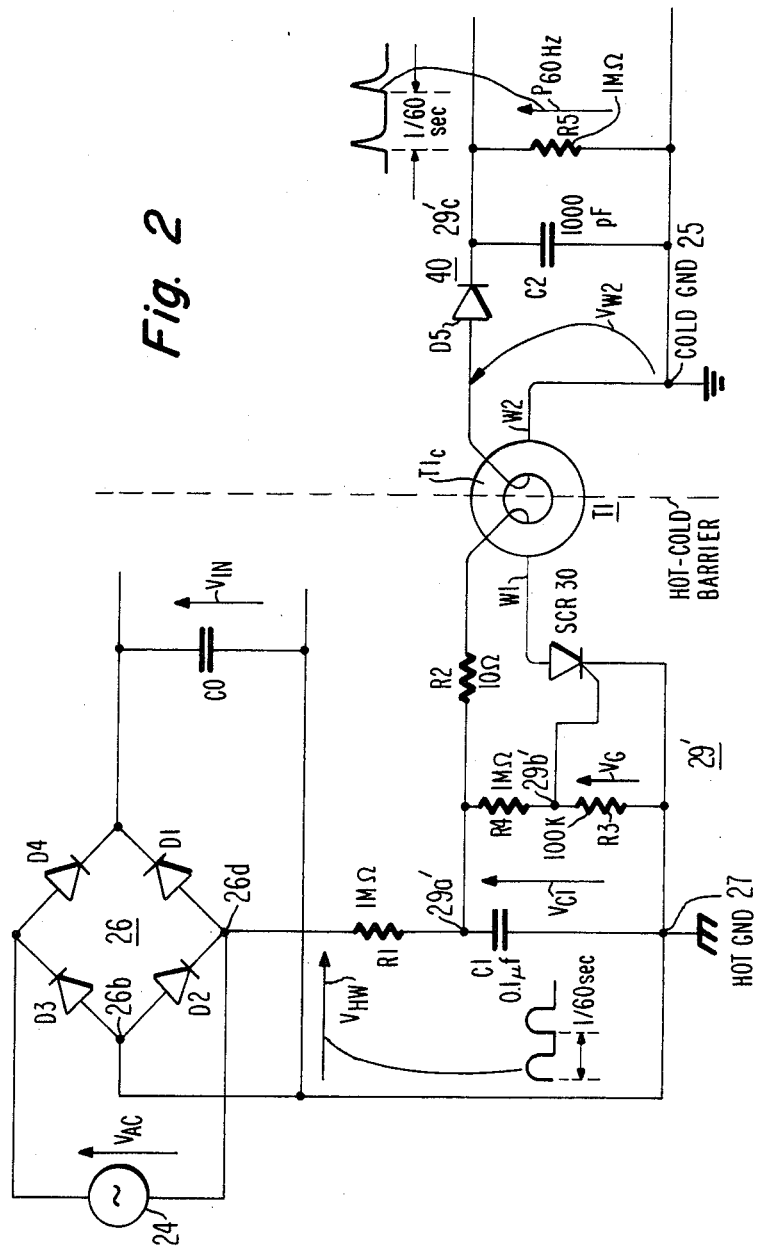
FIG. 2 illustrates a detailed schematic diagram of a first embodiment of a time-of-day measurement circuit of FIG. 1, embodying an aspect of the invention, that generates a periodic output signal that contains time reference information.
Figure 3:
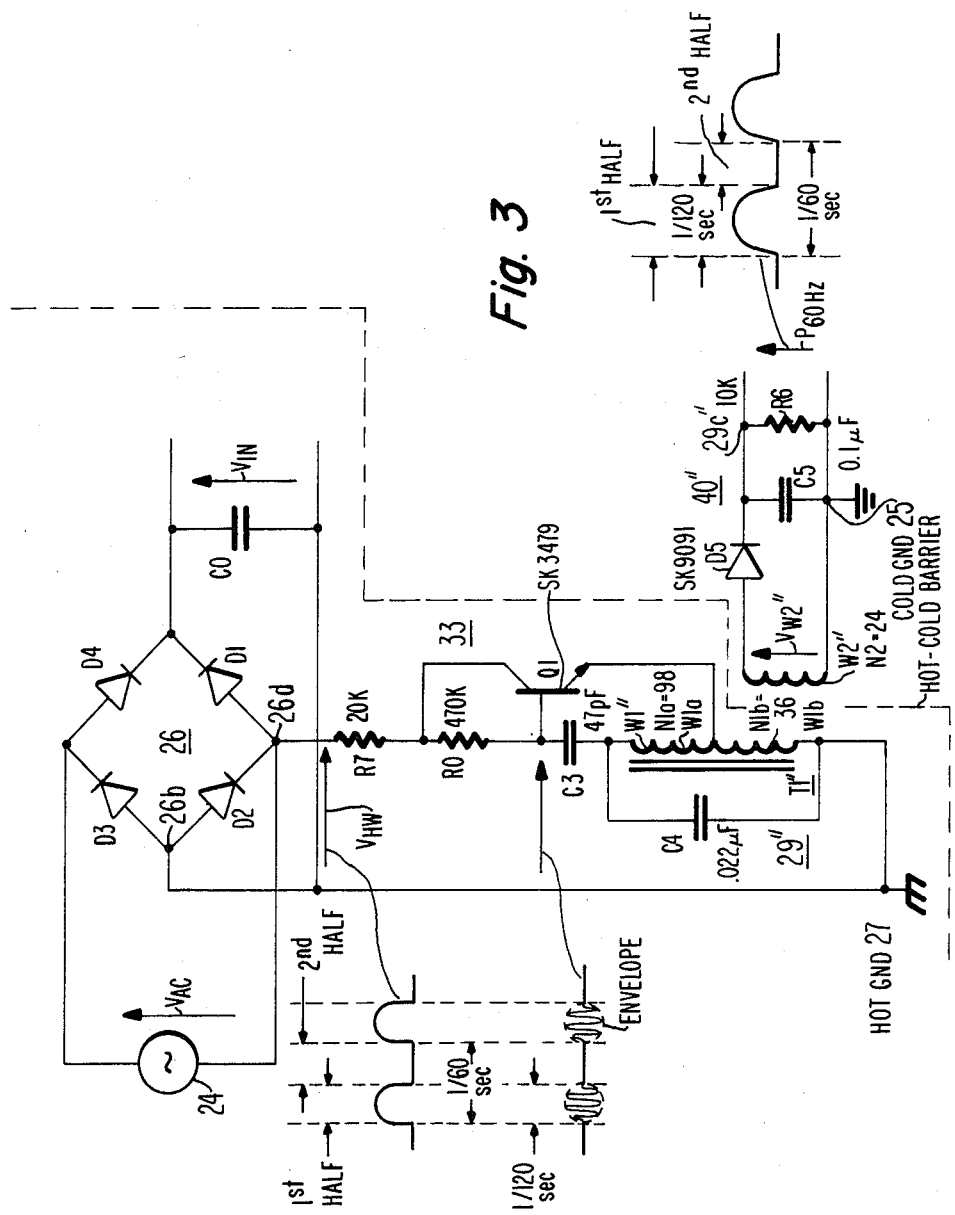
FIG. 3 illustrates a detailed schematic of a second inventive embodiment of the time-of-day measurement circuit of FIG. 1, that generates the periodic signal.

FIGS. 2 and 3 illustrate a portion of the arrangement of FIG. 1 including circuits 29' and 29", representing, respectively, first and second embodiments of time reference signal generating circuit 29 of FIG. 1, embodying the invention. Similar numerals and symbols of FIGS. 1, 2 and 3 illustrate similar items or functions. Half-wave rectified signal $V_{HW}$ of FIGS. 2 and 3 is coupled from bridge rectifier 26 of FIG. 1. Signal $P_{60HZ}$ of FIGS. 2 or 3 is coupled to time-of-day measurement circuit 20 of FIG. 1 to provide time reference information at the frequency of AC voltage $V_{AC}$.

In circuit 29' of FIG. 2, resistors R1, R4 and R3 are series coupled between terminal 26d of bridge rectifier 26 and hot ground conductor 27 that is at the potential of current return terminal 26b of bridge rectifier 26. A capacitor C1 is coupled between a terminal 29'a, that is at the junction between resistors R1 and R4, and hot ground conductor 27 for developing an upramping voltage $V_{C1}$. Upramping voltage $V_{C1}$ is developed during the first half-period of signal $V_{HW}$. The time constant for developing upramping voltage $V_{C1}$ is determined, in a well known manner, by resistors R1, R4 and R3 and by capacitor C1. A voltage $V_G$ that is equal to a portion of upramping voltage $V_{C1}$ is developed between a terminal 29'b that is at the junction of resistors R4 and R3 and hot ground conductor 27. Voltage $V_G$ is coupled between the gate electrode and the cathode electrode of a silicon controlled rectifier (SCR) 30 for turning on, or "firing", of SCR 30 when voltage $V_G$ exceeds the threshold turn-on voltage of SCR 30. The cathode electrode of SCR 30 is coupled to hot ground 27. The anode electrode of SCR 30 is coupled through a single-turn primary winding W1 of a high frequency transformer T1 that is in series with a current limiting resistor R2 to terminal 29'a. Primary winding W1 and a single-turn secondary winding W2 are wound around a ferrite core T1c of transformer T1. Secondary winding W2 is coupled to the anode electrode of a diode D5 of a pulse shaping circuit 40. The cathode electrode of diode D5 is coupled to a junction terminal 29'c of a parallel arrangement that includes a capacitor C2 and a resistor R5, both of pulse shaping circuit 40. Diode D5 couples only the positive portion of a signal $V_{W2}$, developed across winding W2, to terminal 29'c. The other end terminals of capacitor C2 and resistor R5 are coupled to cold ground conductor 25.

In operation, SCR 30 is turned-on when voltage $V_G$ obtained from upramping voltage $V_{C1}$ across capacitor C1 exceeds the threshold turn-on voltage of SCR 30 during each first half-period of signal $V_{HW}$. When SCR 30 is turned on, the anode-to-cathode current of SCR 30 quickly discharges capacitor C1 through the series coupled resistor R2 and primary winding W1. As a result of the discharging current through primary winding W1, a sizable but short duration pulse of signal $V_{W2}$ is developed across secondary winding W2. The short duration pulse across secondary winding W2 charges capacitor C2 through diode D5 to produce the rising edge of each pulse of signal $P_{60HZ}$. The discharging current causes core T1c of transformer T1 to saturate. When transformer T1 saturates, the trailing edge of the short duration pulse of signal $V_{W2}$ that appears across secondary winding W2 is formed. After the trailing edge of the pulse of signal $V_{W2}$ has occurred, caused by the saturation of transformer T1, capacitor C2 is discharged gradually through resistor R5 to provide the trailing edge of the corresponding pulse of signal $P_{60HZ}$. Thus capacitor C2 and resistor R5 cause the stretching, or the increasing of the width, of the short duration pulse of signal $V_{W2}$. Such stretching may be required to conform to the minimum pulse width requirements of circuit components of time-of-day measurement circuit 20 of FIG. 1 that receive signal $P_{60HZ}$ at terminal CK. Note that the duration of each pulse signal $V_{W2}$, that may be a fraction of one microsecond long, is substantially shorter than the period of signal $V_{HW}$ that is equal to 16.7 milliseconds.

In accordance with an aspect of the invention, the short duration, discharging pulse current in primary winding W1 of FIG. 2 permits using a small, inexpensive high frequency transformer such as transformer T1 for conductively isolating hot ground conductor 27 from cold ground conductor 25.

SCR 30 is turned on once, and turned off once, in each cycle of voltage $V_{AC}$. Therefore, when voltage $V_{AC}$ is at a frequency of, for example, 60 HZ, signal $P_{60HZ}$ contains pulses at the same 60 HZ frequency.

In accordance with another aspect of the invention, high frequency transformer T1 also capacitively decouples cold ground conductor 25 from hot ground conductor 27. Because of the low capacitance between windings W1 and W2, low frequency current, such as at 60 Hz, is not coupled from hot ground conductor 27 to cold ground conductor 25.

FIG. 3 illustrates circuit 29" that is a second embodiment of time reference signal generating circuit 29 of FIG. 1, embodying another aspect of the invention. Circuit 29" of FIG. 3 includes an oscillator 33 that is energized by half-wave rectified signal $V_{HW}$ between terminal 26d of bridge rectifier 26 and hot ground conductor 27 that is at the potential of current return terminal 26b of bridge rectifier 26.

In accordance with a further aspect of the invention, oscillator 33 oscillates at a high frequency, such as 130 KHZ, when half-wave rectified signal $V_{HW}$ is positive during the first-half period of signal $V_{HW}$, but does not oscillate throughout the second-half period of signal $V_{HW}$ when signal $V_{HW}$ is substantially zero.

Oscillator 33, operates as a conventional Hartley type oscillator and includes a primary winding W1" of a transformer T1". The inductance of winding W1" that is coupled in parallel with a capacitor C4 provides a tuned circuit that is tuned to a frequency substantially higher than that of voltage $V_{AC}$ such as, for example, 130 KHZ. An intermediate tap of winding W1", that divides winding W1" to a first portion winding W1a and a second portion winding W1b, is coupled to an emitter electrode of a transistor Q1. The base electrode of transistor Q1 is coupled through a DC blocking capacitor C3 to one plate of tuning capacitor C4. The end terminal of winding W1b, that is coupled to the other plate of capacitor C4, is at the potential of hot ground conductor 27. A resistor R7 couples signal $V_{HW}$ from terminal 26d of bridge rectifier 26 to the collector electrode of transister Q1 to provide the collector-to-emitter voltage of transistor Q1 during the first-half period of signal $V_{HW}$. Resistor R7 is coupled to the base electrode of transistor Q1 through a resistor R0 to provide base current to transistor Q1.

In operation, oscillator 33 generates a burst, or a plurality of cycles at high frequency, of signal $V_{W2}"$ across a secondary winding W2", during each first half-period of signal $V_{HW}$. During the second half-period of signal $V_{HW}$, oscillator 33 does not oscillate.

Each burst of the high frequency signal of signal $V_{W2}"$ that occurs during the first half-period of signal $V_{HW}$ is coupled to the anode of a diode D5 of a pulse shaping circuit 40". The cathode of diode D5 is coupled to a junction terminal 29c" in FIG. 3 that is at one junction of a parallel arrangement of a resistor R6 and a capacitor C5 of circuit 40". The other junction of resistor R6 and capacitor C5 is at the potential of cold ground conductor 25. Pulse shaping circuit 40" operates as a conventionally built amplitude modulated signal detector. Circuit 40" demodulates amplitude modulated signal $V_{W2}"$ to extract the envelope of the positive peak pulses of the high frequency signal in each burst of signal $V_{W2}"$. Such envelope that occurs in each first half-period of signal $V_{HW}$ represents a corresponding pulse of signal $P_{60HZ}$. Each burst of high frequency pulses occurs in the first-half period of signal $V_{HW}$ and has an envelope that follows the waveform of signal $V_{HW}$. Therefore, the freuqency of signal $P_{60HZ}$ that contains the envelope of each burst is equal to that of voltage $V_{AC}$.

In accordance with yet another aspect of the invention high frequency transformer T1" of FIG. 3 that requires small number of turns in primary winding W1" conductively isolates and capacitively decouples signal $P_{60Hz}$ from AC mains supply source 24. Transformer T1" may be constructed using an air "core" or a ferrite core.

What is claimed:

1. An apparatus for generating from an AC mains voltage a periodic clock signal at a frequency related to the frequency of said AC mains voltage that provides timing information to a time-of-day display, comprising:
    a source of said AC mains voltage;
    means responsive to said AC mains voltage for generating therefrom a periodic first signal having pulses that occur at a repetition frequency that is related to the frequency of said AC mains voltage such that a given pulse of said pulses has a duration that is substantially shorter than the half-period of said AC mains voltage;
    magnetic coupling means, having a conductively nonisolated section that is conductively coupled to said AC mains voltage and that is coupled to said periodic first signal, for magnetically coupling said periodic first signal to a conductively isolated section of said magnetic coupling means that is conductively isolated from said AC mains voltage and that is magnetically coupled to said nonisolated section to generate a periodic second signal such that said magnetic coupling means conductively isolates said second signal from said AC mains voltage;
    means conductively isolated from said mains voltage and responsive to said periodic second signal for generating said clock signal; and
    a time-of-day measurement circuit coupled to said clock signal generating means and conductively isolated from said AC mains voltage for counting pulses of said clock signal to generate a signal that contains time-of-day information, said time-of-day information containing signal being coupled to said display for displaying the time-of-day information contained in said time-of-day information containing signal.

2. An apparatus according to claim 1 wherein said first signal generating means comprises a capacitor coupled to said AC mains voltage that is charged therefrom during a portion of each period of said AC mains voltage and means responsive to the voltage in said capacitor for generating from the voltage in said capacitor said given pulse of said first signal when the voltage in said capacitor exceeds a predetermined value.

3. An apparatus according to claim 2 further comprising a bridge rectifier having a pair of terminals that are coupled to said AC mains voltage, having a current return terminal and having an output terminal for developing at said output terminal a rectified supply voltage relative to said current return terminal and for developing a half-wave rectified voltage between a terminal of said pair of terminals of said bridge rectifier and said current return terminal, wherein said half-wave rectified voltage is coupled to said capacitor for charging said capacitor from said half-wave rectified voltage during said portion of each period of said AC mains voltage.

4. An apparatus according to claim 2 wherein said first signal generating means further comprises switching means responsive to said AC mains voltage for discharging through said nonisolated section of said magnetic coupling means the charge in said capacitor, when the voltage in said capacitor exceeds a predetermined value, such that the discharging of said capacitor occurs during an interval that is substantially shorter than half the period of said AC mains voltage so as to generate from the voltage in said capacitor said given pulse of said first signal.

5. An apparatus as recited in claim 4 wherein said switching means comprises an SCR having the gate thereof coupled to said capacitor for turning-on said SCR when the voltage in said capacitor exceeds said predetermined value.

6. An apparatus according to claim 1 wherein said nonisolated section of said magnetic coupling means comprises a single winding turn.

7. An apparatus according to claim 1 wherein said first signal is magnetically coupled to said isolated section of said magnetic coupling means to develop therein a nonsymmetrical alternating current signal having a duty cycle that is substantially shorter than one-half, and wherein said clock signal generating means comprises a rectifier coupled to said isolated section for rectifying the signal in said isolated section to generate said clock signal.

8. An apparatus according to claim 7 further comprising, a capacitor coupled to said rectifier that charges said capacitor from the signal in said isolated section when the signal in said isolated section is at a first polarity, and means coupled to said capacitor for discharging said capacitor after said capacitor is charged by said rectifier, at such discharge rate that each said pulse of said clock signal that is generated from the corresponding voltage in said capacitor has a sufficient duration that is required by said time-of-day measurement circuit.

9. An apparatus according to claim 1 wherein said first signal generating means comprises a source of a high frequency signal at a frequency that is substantially higher than the frequency of said AC mains voltage and means responsive to said AC mains voltage for modulating said high frequency signal in accordance with said AC mains voltage to generate said first signal.

10. An apparatus according to claim 9 wherein said source of high frequency signal comprises an oscillator that generates said high frequency signal and wherein said modulating means is coupled to said oscillator for generating said high frequency signal during a first portion of each period of said AC mains voltage and for preventing said oscillator from generating said high frequency signal during a second portion of each period of said AC mains voltage.

11. An apparatus according to claim 9 wherein said modulating means modulates the amplitude of said high frequency signal such that said first signal includes a component signal at said freuqency that is related to the frequency of said AC mains voltage.

12. An apparatus according to claim 11 wherein said clock signal generating means comprises a demodulator responsive to the signal in said isolated section that is magnetically coupled from said nonisolated section for separating said component signal from said first signal to generate therefrom said clock signal.

13. An apparatus according to claim 9 wherein said modulating means comprises a bridge rectifier having a pair of terminals that are coupled to said AC mains voltage, having a current return terminal and having an output terminal for developing at said output terminal a rectified supply voltage relative to said current return terminal and for developing between a terminal of said pair of terminals of said bridge rectifier and said current return terminal a half-wave rectified voltage, said half-wave rectified voltage being coupled to said source of high frequency signal for modulating the amplitude of said high frequency signal in accordance with the instantaneous value of said half-wave rectified voltage to generate said first signal.

14. An apparatus according to claim 13 wherein said clock signal geenrating means comprises a demodulator, responsive to a signal at said conductively isolated section that is derived in said magnetic coupling means from said first signal, for forming said clock signal in accordance with the envelope of the peak amplitude of said signal at said conductively isolated section.

15. An apparatus according to claim 1 wherein said first signal generating means generates said first signal at the same frequency of said AC mains voltage.

16. An apparatus for generating from an AC mains voltage a periodic clock signal at a frequency that is related to the frequency of said AC mains voltage that provides timing information to a time-of-day display, comprising:
 a source of said AC mains voltage;
 a bridge rectifier having a pair of input terminals that are coupled to said source for supplying, from said AC mains voltage, a full-wave rectified supply voltage between an output terminal and a current return terminal of said bridge rectifier, and for generating from said AC mains voltage a periodic half-wave rectified signal at a first terminal of said pair of input terminals;
 a first load circuit energized by said full-wave rectified supply voltage;
 magnetic coupling means having a first section responsive to said periodic half-wave rectified signal for generating in a second section of said magnetic coupling means that is magnetically coupled to, and conductively isolated from, said first section a periodic signal that is repetitive at a frequency related to the frequency of said AC mains voltage, said magnetic coupling means conductively isolating said second signal from said AC mains voltage;
 means conductively isolated from said AC mains voltage and responsive to said periodic second signal for generating said clock signal; and
 a time-of-day measurement circuit coupled to said clock signal generating means and conductively isolated from said AC mains voltage for counting pulses of said clock signal to generate a signal that contains time-of-day information, said time-of-day information containing signal being coupled to said display that displays the time-of-day information contained in said time-of-day information containing signal.

17. An apparatus for generating from an AC mains voltage a periodic clock signal at a frequency related to the frequency of said AC mains voltage that provides timing information to a time-of-day display, comprising:

a source of said AC mains voltage;

means for generating a high frequency signal at a frequency that is substantially higher than that of said AC mains voltage;

means responsive to said AC mains voltage for modulating said high frequency signal in accordance with the instantaneous value of said AC mains voltage to form a modulated signal that includes a component signal at said frequency that is related to the frequency of said AC mains voltage;

magnetic coupling means having conductively nonisolated section coupled to said modulated signal for magnetically coupling said modulated signal to a conductively isolated section of said transformer that is magnetically coupled to, and conductively isolated from, said nonisolated section to generate a periodic second signal such that said magnetic coupling means conductively isolates said second signal from said AC mains voltage;

means conductively isolated from said mains voltage and responsive to said periodic second signal for generating said clock signal; and a time-of-day measurement circuit coupled to said clock signal generating means and conductively isolated from said AC mains voltage for counting pulses of said clock signal to generate a signal that contains time-of-day information, said time-of-day information containing signal being coupled to said display that displays the time-of-day information contained in said time-of-day information containing signal.

18. An apparatus according to claim 17 wherein said clock signal generating means comprises a demodulator responsive to said signal in said isolated section that is coupled from said nonisolated section for separating said component signal of said modulated signal to generate from said component signal said clock signal.

19. An apparatus for generating from an AC mains voltage a clock signal that provides timing information representative of the AC mains frequency of said AC mains voltage to a time-of-day display, comprising:

a source of said AC mains voltage for generating therefrom a first signal that contains said timing information and that has a high frequency component substantially higher than said AC mains frequency;

magnetic coupling means, having a conductively nonisolated section coupled to said first signal, for magnetically coupling said high frequency component of said first signal to a conductively isolated section of said magnetic coupling means that is magnetically coupled to, and conductively isolated from, said nonisolated section to generate a second signal such that said magentic coupling means conductively isolates said second signal from said AC mains voltage source;

means conductively isolated from said mains voltage source and responsive to said second signal for generating said clock signal; and a time-of-day measurement circuit coupled to said clock signal generating means and conductively isolated from said AC mains voltage for counting pulses of said clock signal to generate a signal that contains time-of-day information, said time-of-day information containing signal being coupled to said display that displays the time-of-day information contained in said time-of-day information containing signal.

20. An apparatus according to claim 1 wherein said magnetic coupling means comprises a high frequency transformer.

* * * * *